(12) United States Patent
Bowen

(10) Patent No.: US 9,536,886 B2
(45) Date of Patent: Jan. 3, 2017

(54) CMOS COMPATIBLE RESONANT INTERBAND TUNNELING CELL

(71) Applicant: Christopher Bowen, Austin, TX (US)

(72) Inventor: Christopher Bowen, Austin, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/045,930

(22) Filed: Feb. 17, 2016

(65) Prior Publication Data

US 2016/0260721 A1  Sep. 8, 2016

Related U.S. Application Data

(60) Provisional application No. 62/127,226, filed on Mar. 2, 2015.

(51) Int. Cl.
| | | |
|---|---|---|
| *H01L 27/11* | (2006.01) | |
| *H01L 27/092* | (2006.01) | |
| *H01L 29/66* | (2006.01) | |

(52) U.S. Cl.
CPC ......... *H01L 27/1116* (2013.01); *H01L 27/092* (2013.01); *H01L 27/1104* (2013.01); *H01L 29/66977* (2013.01)

(58) Field of Classification Search
CPC ............ H01L 27/1116; H01L 29/66977; H01L 27/1104; H01L 27/092
See application file for complete search history.

(56) References Cited

U.S. PATENT DOCUMENTS

| | | |
|---|---|---|
| 5,093,699 A | 3/1992 | Weichold et al. |
| 5,953,249 A | 9/1999 | van der Wagt |
| 6,118,136 A | 9/2000 | Liu et al. |
| 6,130,559 A | 10/2000 | Balsara et al. |
| 6,465,804 B1 | 10/2002 | Shamir et al. |
| 6,512,274 B1 | 1/2003 | King et al. |

(Continued)

OTHER PUBLICATIONS

Chung et al., "Integration of Si/SiGe HBT And Si-based RITD Demonstrating Controllable Negative Differential Resistance For Wireless Applications", Solid-State Electronics, vol. 50, No. 6, Jun. 2006, pp. 973-978.

(Continued)

*Primary Examiner* — Karen Kusumakar
(74) *Attorney, Agent, or Firm* — Myers Bigel, P.A.

(57) ABSTRACT

A semiconductor device includes a first diode connected transistor of a first conductivity type and a second diode connected transistor of a second conductivity type connected in series, each of the first and second diode connected transistors being configured to exhibit negative differential resistance in response to an applied voltage. The first drain and first source regions of the first diode connected transistor include dopants of the first conductivity type at degenerate dopant concentration levels and a gate of the first diode connected transistor has a work function that corresponds to that of the semiconductor containing dopants of the second conductivity type. The second drain and second source regions of the second diode connected transistor include dopants of the second conductivity type at degenerate dopant concentration levels and a gate of the second diode connected transistor has a work function that corresponds to that of the semiconductor containing dopants of the first conductivity type.

20 Claims, 16 Drawing Sheets

(56) References Cited

U.S. PATENT DOCUMENTS

| | | | |
|---|---|---|---|
| 6,765,303 | B1 | 7/2004 | Krivokapic et al. |
| 7,002,175 | B1 | 2/2006 | Singh et al. |
| 7,016,224 | B2 | 3/2006 | King |
| 7,113,423 | B2 | 9/2006 | King |
| 7,208,753 | B2 | 4/2007 | Yang et al. |
| 7,303,969 | B2 | 12/2007 | Berger et al. |
| 7,683,364 | B2 | 3/2010 | Edwards et al. |
| 8,629,047 | B2 | 1/2014 | Cheng et al. |
| 8,860,160 | B2 | 10/2014 | Cheng et al. |
| 2005/0056827 | A1 | 3/2005 | Li et al. |
| 2009/0057651 | A1* | 3/2009 | Edwards ............ H01L 27/0629 257/24 |
| 2012/0199814 | A1 | 8/2012 | Berger |

OTHER PUBLICATIONS

Chung et al., "Monolithic Vertical Integration of Si/SiGe HBT And Si-based Resonant Interband Tunneling Diode Demonstrating Latching Operation And Adjustable Peak-To-Valley Current Ratios", IEEE International Electron Devices Meeting, Dec. 2003, 4 pages.

Huber, John L., "Physics of Novel InAs/AlSb/GaSb Resonant Interband Tunneling Structures", Doctoral Dissertation, Yale University, May 1997, 81 pages.

Söderström et al., "New Negative Differential Resistance Device Based on Resonant Interband Tunneling", Applied Physics Letters, vol. 55, No. 11, Sep. 1989, pp. 1094-1096.

* cited by examiner

CMOS COMPATIBLE RESONANT INTERBAND TUNNELING CELL

CROSS REFERENCE TO RELATED APPLICATION

This application claims the benefit of U.S. Provisional Application No. 62/127,226 filed Mar. 2, 2015, the disclosure of which is hereby incorporated herein by reference.

FIELD

The present disclosure relates to the field of semiconductor devices and, more particularly, to semiconductor memory devices.

BACKGROUND

A static random-access memory (SRAM) device is a type of semiconductor memory that uses bistable latching circuitry to store each data bit. SRAM devices, in contrast with dynamic random-access memory (DRAM) devices, have the ability to maintain the stored data without needing the data to be periodically refreshed. A memory cell in a conventional SRAM device is shown in FIG. 1. Referring to FIG. 1, the single SRAM cell may comprise first and second driving transistors TN1 and TN2, first and second load transistors TP1 and TP2, and first and second access transistors TN3 and TN4. Source terminals of the first and second driving transistors TN1 and TN2 may be connected to a ground voltage line Vss, and source terminals of the first and second load transistors TP1 and TP2 may be connected to a power voltage line Vdd.

The first driving transistor TN1 comprising an NMOS transistor and the first load transistor TP1 comprising a PMOS transistor may be configured as a first inverter, and the second driving transistor TN2 comprising an NMOS transistor and the second load transistor TP2 comprising a PMOS transistor may be configured as a second inverter.

Output terminals of the first and second inverters may be connected to source terminals of the first and second access transistors TN3 and TN4. In addition, input and output terminals of the first and second inverters may intersect with each other and be connected to each other. Drain terminals of the first and second access transistors TN3 and TN4 may be connected to first and second bit lines BL and /BL, respectively.

As shown in FIG. 1, a single SRAM memory cell may comprise six transistors, which may consume significant SRAM layout real estate in integrated circuit memory devices as SRAM device density increases.

SUMMARY

In some embodiments of the inventive concept, a semiconductor device comprises a first diode connected transistor of a first conductivity type and a second diode connected transistor of a second conductivity type connected in series, each of the first and second diode connected transistors being configured to exhibit negative differential resistance in response to an applied voltage. The first drain and first source regions of the first diode connected transistor comprise dopants of the first conductivity type at degenerate dopant concentration levels and a gate of the first diode connected transistor comprises dopants of the second conductivity type. The second drain and second source regions of the second diode connected transistor comprise dopants of the second conductivity type at degenerate dopant concentration levels and a gate of the second diode connected transistor comprises dopants of the first conductivity type.

In other embodiments, a channel region of the first diode connected transistor comprises dopants of the second conductivity type at a non-degenerate dopant concentration level. A channel region of the second diode connected transistor comprises dopants of the first conductivity type at a non-degenerate dopant concentration level.

In still other embodiments, the dopant concentration levels of the first drain and the first source regions and the dopant concentration levels of the second drain and second source regions are each at least $10^{19}$ cm$^{-3}$.

In still other embodiments, the first conductivity type is n-type and the second conductivity type is p-type. The gate of the first diode connected transistor has a work function of at least about 5.1 eV and the gate of the second diode connected transistor has a work function not greater than about 4.2 eV.

In still other embodiments, the channel region of the first diode connected transistor has first deep level traps formed therein and the channel region of the second diode connected transistor has second deep level traps formed therein.

In still other embodiments, the first deep level traps are formed more proximal to the valence band edge than the conduction band edge and the second deep level traps are formed more proximal to the conduction band edge than the valence band edge.

In still other embodiments, the channel region of each of the first and second diode connected transistors comprises at least one of Si, Ge, InGaAs, C, MoS$_2$, and Sn.

In still other embodiments, the first diode connected transistor and the second diode connected transistor are connected at a storage node. The device further comprises a write field effect transistor comprising a source terminal connected to a write bit line, a gate terminal connected to a write word line, and a drain terminal connected to the storage node; and a read field effect transistor comprising a source terminal connected to a read bit line, a gate terminal connected to the storage node, and a drain terminal connected to a read word line.

In still other embodiments, the first diode connected transistor and the second diode connected transistor are connected at a storage node. The device further comprises a pass gate field effect transistor comprising a source terminal connected to a bit line, a gate terminal connected to a word line, and a drain terminal connected to the storage node; and a capacitor connected to the storage node.

In further embodiments of the inventive concept, a semiconductor device comprises a first transistor of a first conductivity type and a second transistor of a second conductivity type connected in series, each of the first and second transistors being configured to exhibit negative differential resistance in response to an applied voltage. The first drain and first source regions of the first transistor comprise dopants of the first conductivity type at degenerate dopant concentration levels and a gate of the first transistor comprises dopants of the second conductivity type. The second drain and second source regions of the second transistor comprise dopants of the second conductivity type at degenerate dopant concentration levels and a gate of the second transistor comprises dopants of the first conductivity type.

In still further embodiments, the first transistor and the second transistor are connected in series between a reference voltage and a common voltage. The reference voltage is less than a power supply voltage.

In still further embodiments, the reference voltage is in a range of approximately 50 mV-200 mV.

In still further embodiments, a channel region of the first transistor comprises dopants of the second conductivity type at a non-degenerate dopant concentration level. A channel region of the second transistor comprises dopants of the first conductivity type at a non-degenerate dopant concentration level.

In still further embodiments, the dopant concentration levels of the first drain and the first source regions and the dopant concentration levels of the second drain and second source regions are each at least $10^{19}$ cm$^{-3}$.

In still further embodiments, the first conductivity type is n-type and the second conductivity type is p-type. The gate of the first transistor has a work function of at least about 5.1 eV and the gate of the second transistor has a work function not greater than about 4.2 eV.

In still further embodiments, the channel region of the first transistor has first deep level traps formed therein and the channel region of the second transistor has second deep level traps formed therein.

In still further embodiments, the first deep level traps are formed more proximal to the valence band edge than the conduction band edge and the second deep level traps are formed more proximal to the conduction band edge than the valence band edge.

In still further embodiments, the channel region of each of the first and second transistors comprises at least one of Si, Ge, InGaAs, C, MoS$_2$, and Sn.

In still further embodiments, a gate terminal of the first transistor and a gate terminal of the second transistor are connected at a storage node and the first drain region and the second drain region are connected separately from the storage node. The device further comprises a write field effect transistor comprising a source terminal connected to a write bit line, a gate terminal connected to a write word line, and a drain terminal connected to the storage node; and a read field effect transistor comprising a source terminal connected to a read bit line, a gate terminal connected to the storage node, and a drain terminal connected to a read word line.

In still further embodiments, a gate terminal of the first transistor and a gate terminal of the second transistor are connected at a storage node and the first drain region and the second drain region are connected separately from the storage node. The device further comprises a pass gate field effect transistor comprising a source terminal connected to a bit line, a gate terminal connected to a word line, and a drain terminal connected to the storage node; and a capacitor connected to the storage node.

It is noted that aspects described with respect to one embodiment may be incorporated in different embodiments although not specifically described relative thereto. That is, all embodiments and/or features of any embodiments can be combined in any way and/or combination. Moreover, other methods, systems, articles of manufacture, and/or computer program products according to embodiments of the inventive subject matter will be or become apparent to one with skill in the art upon review of the following drawings and detailed description. It is intended that all such additional systems, methods, articles of manufacture, and/or computer program products be included within this description, be within the scope of the present inventive subject matter, and be protected by the accompanying claims. It is further intended that all embodiments disclosed herein can be implemented separately or combined in any way and/or combination.

BRIEF DESCRIPTION OF THE DRAWINGS

Other features of embodiments will be more readily understood from the following detailed description of specific embodiments thereof when read in conjunction with the accompanying drawings, in which.

DETAILED DESCRIPTION

Figure 1:
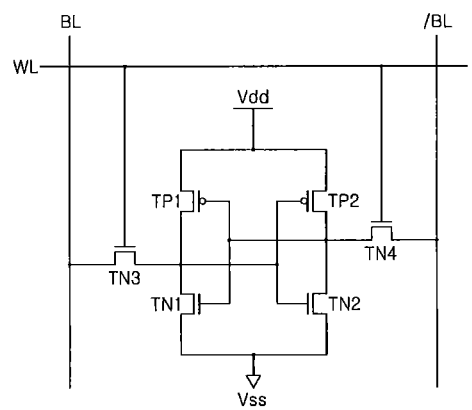
FIG. 1 is a circuit diagram of a conventional static random-access memory (SRAM) cell.

In the following detailed description, numerous specific details are set forth to provide a thorough understanding of embodiments of the present disclosure. However, it will be understood by those skilled in the art that the present invention may be practiced without these specific details. In some instances, well-known methods, procedures, components and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

Some embodiments of the inventive concept stem from a realization that a metal gate CMOS transistor can be configured into a two-terminal or gated three-terminal device capable of exhibiting negative differential resistance (NDR) responsive to an applied voltage. In some embodiments, an NMOS work function gate stack may be formed on a PMOS transistor and a PMOS work function gate stack may be formed on an NMOS transistor. This renders the channel regions biased into or near accumulation at approximately zero gate bias. The accumulated channel couples to the source and drain regions via interband tunneling at zero and low gate bias. Gate bias sweeps (positive for NMOS, negative for PMOS) may cause the device to transition from a state where the bulk of the current is attributed to interband tunneling to p-n junction operation where the bulk of the current is attributed to diffusion. Between the interband tunneling current state and diffusion current state the device generates lower current at higher gate biases, which is the NDR state. The NMOS and PMOS based NDR devices are complementary, which may allow them to be wired in series to form a bistable latch that can hold a logic zero or one state that can be used in an SRAM cell. In some embodiments, the layout area of the bistable latch may be equivalent to that of two transistors. Two additional transistors or a transistor and capacitor may be used to perform read and write operations on the latch so that the total area of the memory cell may be approximately equivalent to four transistors instead of the six transistors used in a conventional SRAM memory cell.

Some embodiments of the inventive concept comprise a memory cell in which a bistable latch is formed using semiconductor devices that exhibit negative differential resistance (NDR). Such NDR devices are p-n junction devices that operate in a particular region of the I-V characteristic based on the quantum mechanical tunneling of electrons through the potential barrier of the junction. One form of an NDR device is known as a resonant interband tunneling diode (RITD). A RITD comprises a p-n junction in which both the n-type and the p-type material are heavily doped, for example, at dopant concentrations of at least about $10^{19}$ cm$^{-3}$. In an n-type material, when the conduction band electron concentration exceeds the effective density of energy states, the Fermi level is no longer within the band gap, but instead lies within the conduction band. When this occurs, the material is called degenerate n-type. Similarly, in a p-type material, when the acceptor concentration is very high the Fermi level is no longer within the band gap, but instead lies within the valence band. Such a material is called degenerate p-type.

Figure 2A:
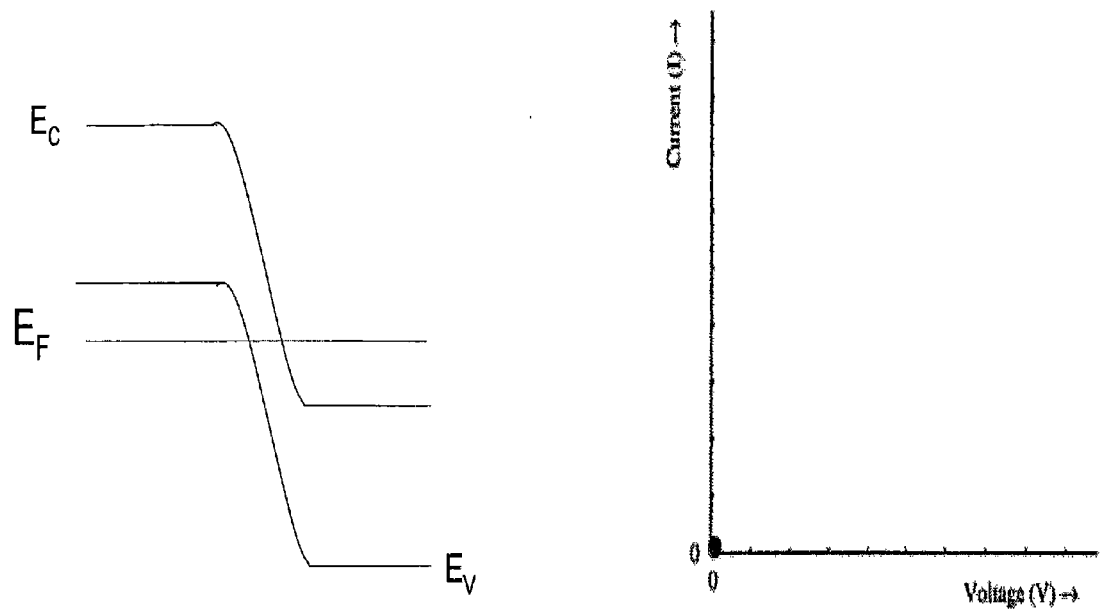
FIGS. 2A-2E are diagrams that illustrate resonant interband tunneling at a p-n junction in accordance with some embodiments of the inventive concept.

Referring now to FIG. 2A, a RITD is shown at equilibrium with Fermi levels aligned. Because the Fermi levels fall in the valence and conductive bands of the p-type and n-type materials, respectively, the bands must overlap on the energy scale. This overlapping of bands means that with a small forward or reverse bias, filled states and empty states appear opposite each other separated by the width of the depletion region, which may be relatively narrow. In some embodiments, the width of the depletion region may less than about 10 nm. The high doping concentrations combined with a narrow depletion region may result in a relatively high electric field at the junction of the two materials. As a result, the conditions for electron tunneling may be met: filled and empty states that are separated by a narrow potential barrier of finite height.

Figure 2B:
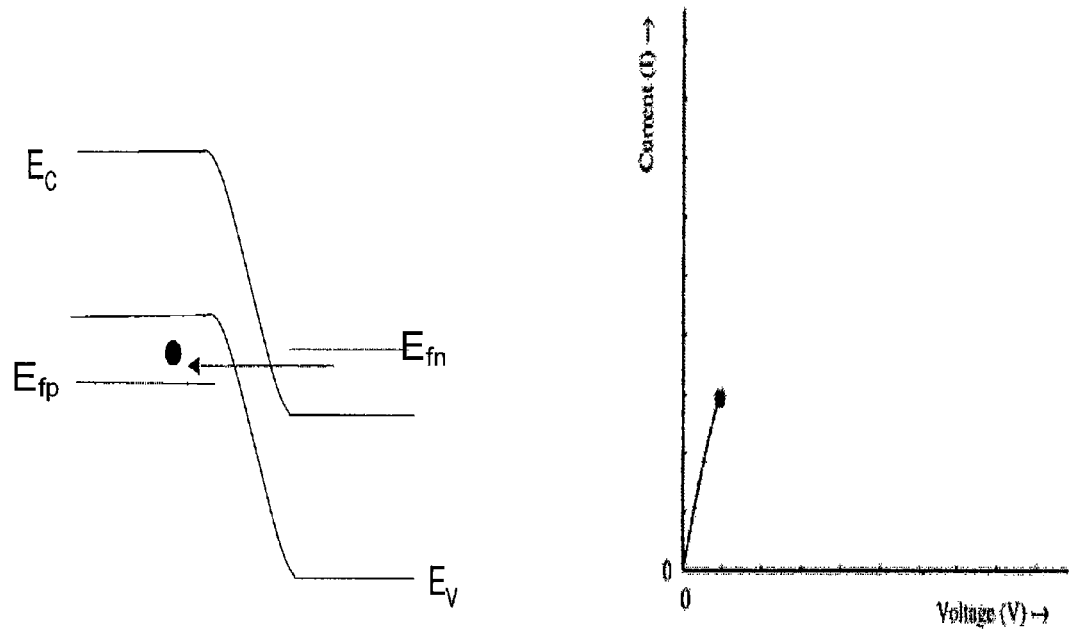
Figure 2C:
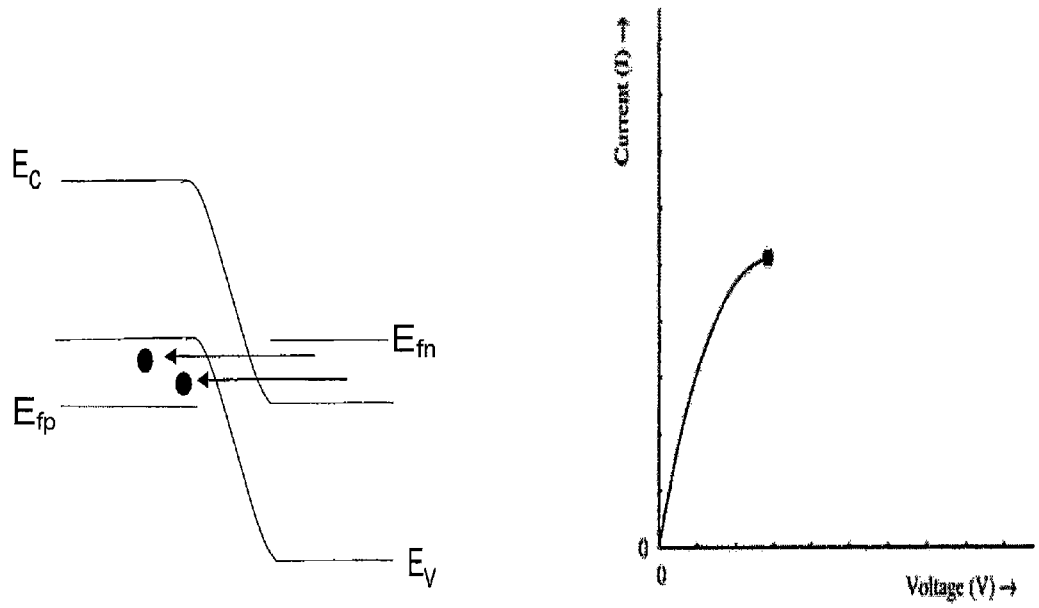
Figure 2D:
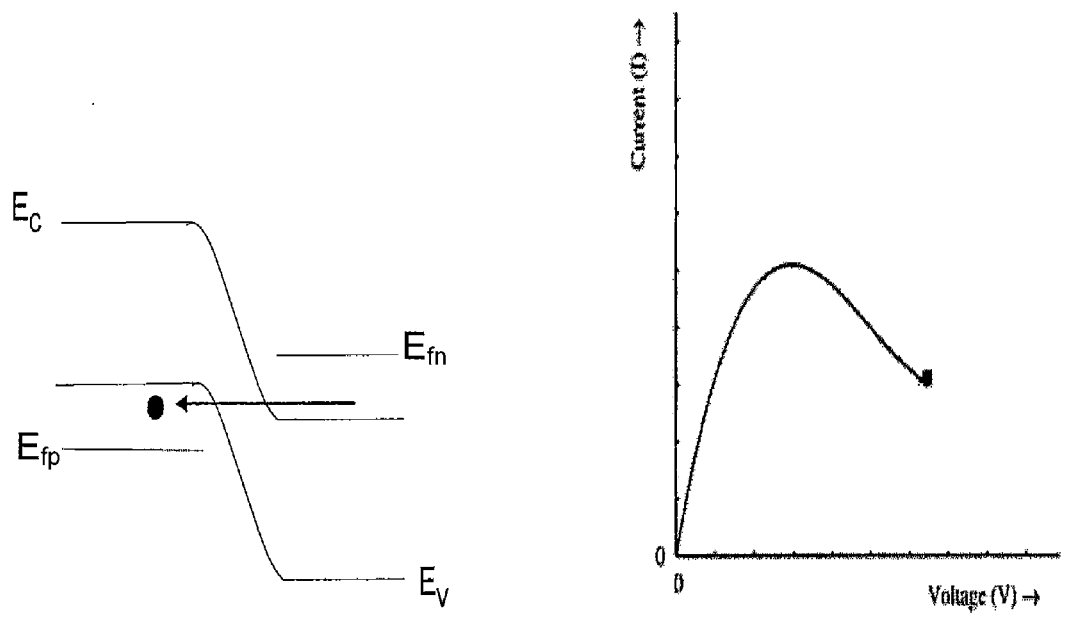
Figure 2E:
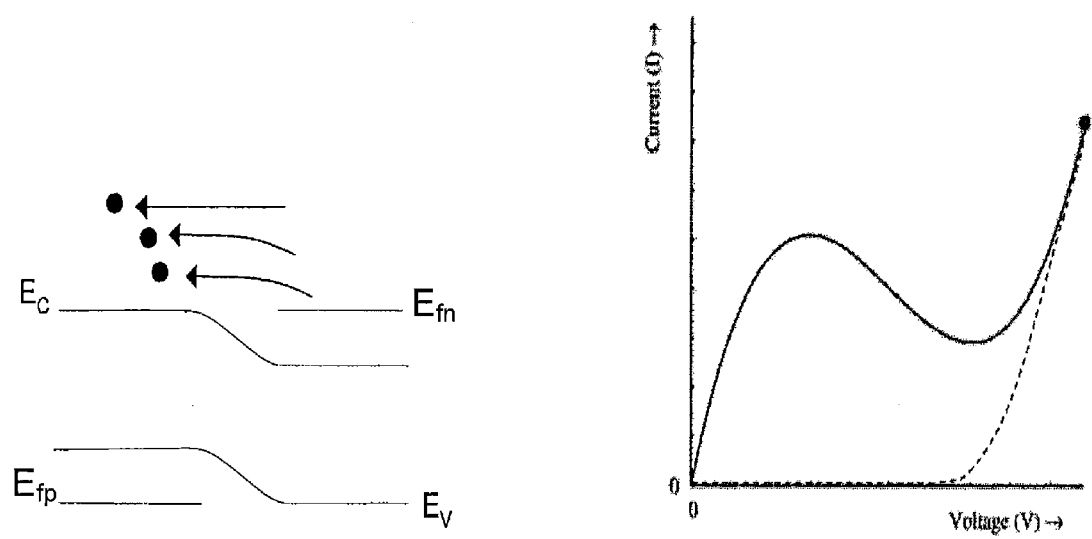

At zero bias as shown in FIG. 2A, there is no current flow. When a small forward bias is applied as shown in FIG. 2B, the Fermi level of the n-type material moves up in energy with respect to the Fermi level of the p-type material resulting in electrons on the n side being placed opposite empty states above the Fermi level on the p side. Electron tunneling occurs from n to p as shown resulting in a conventional current from p to n. The tunneling current continues to increase with increased bias, i.e., larger applied voltage until the energy of the majority of electrons on the n side is equal to that of the empty states in the valence band on the p side. This will produce the maximum tunneling current as shown in FIG. 2C. As the forward bias continues to increase, the number of electrons in the n side that are directly opposite empty states in the valence band on the p side starts to decrease as the bands begin to pass by one another as shown in FIG. 2D. This region of the I-V curve is known as the NDR region as there is a decrease in current despite an increase in applied voltage. As the forward bias is increased beyond the NDR region, the current begins to increase again as shown in FIG. 2E. The I-V characteristic in this region resembles a conventional diode as the bands have passed each other and the forward current is dominated by diffusion current due to electrons surmounting the potential barrier from n to p and holes surmounting the potential barrier from p to n. While diffusion current is present in the forward tunneling region of the I-V curve, it is negligible compared to the tunneling current.

Figure 3:
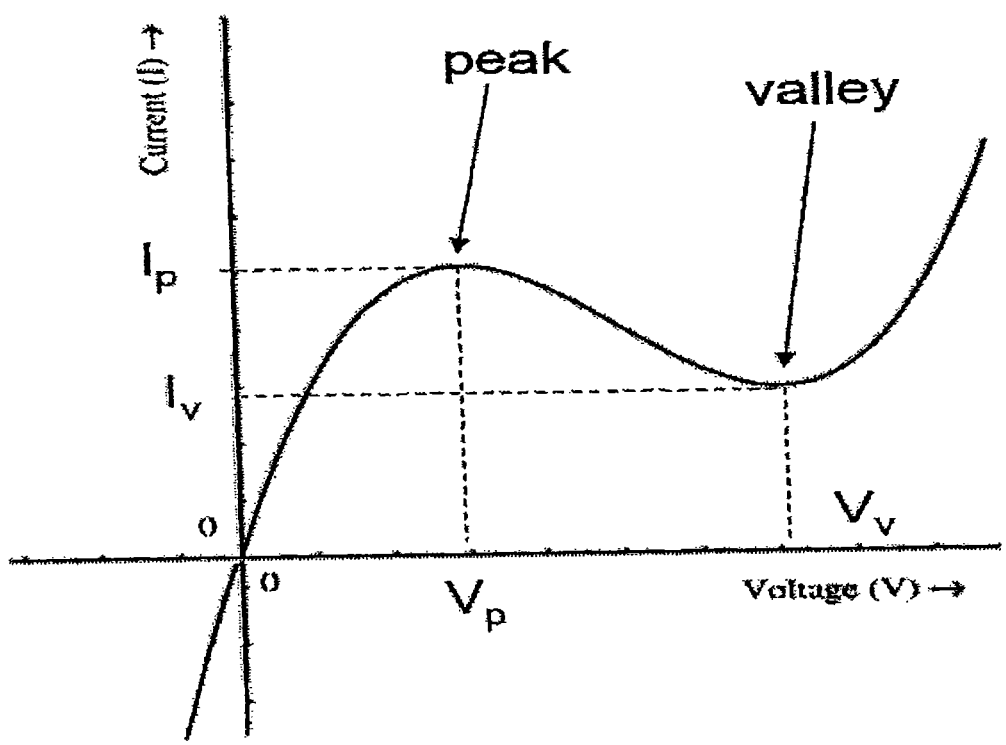
FIG. 3 is a graph of current versus voltage for a semiconductor device that exhibits negative differential resistance (NDR) under an applied voltage.

FIG. 3 illustrates the I-V curve for a RITD device according to some embodiments of the inventive concept. As shown in FIG. 3, the tunneling current increases until a peak current Ip is reached and the device transitions into the NDR region. The current then reaches a low value Iv at the transition from the NDR region to the diffusion current region where the device exhibits traditional diode I-V characteristics with increased voltage.

Figure 4:
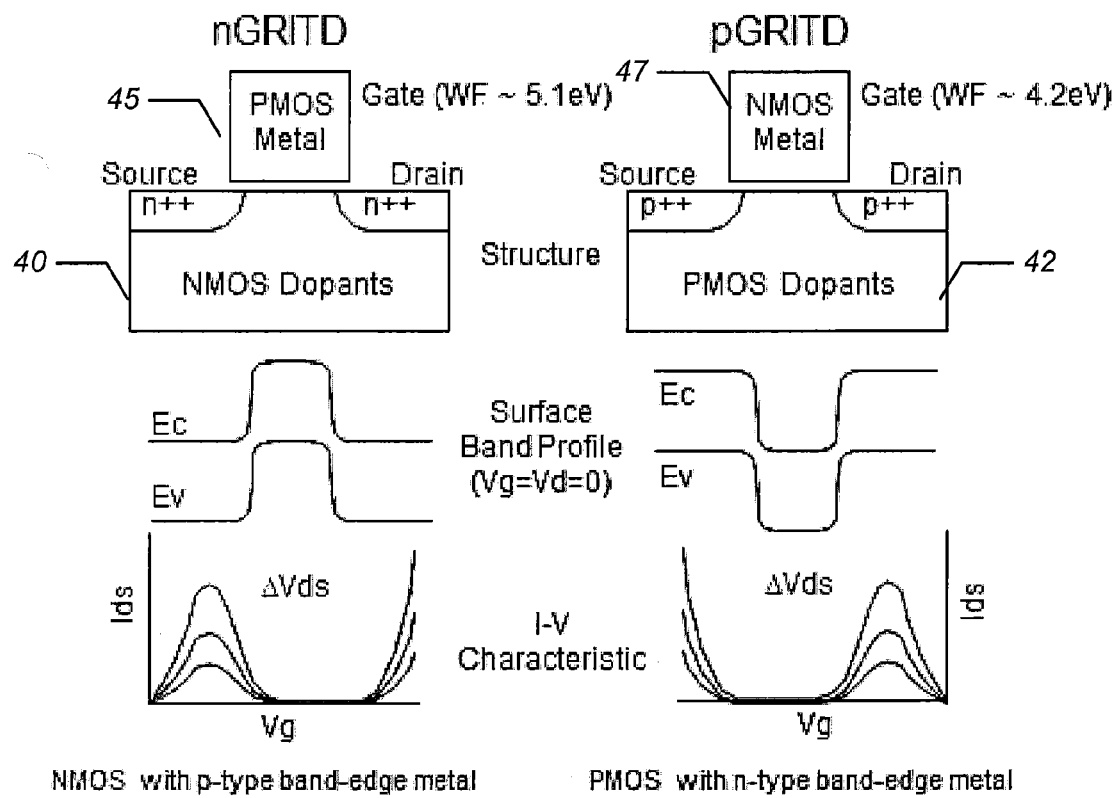
FIGS. 4A and 4B are cross-sectional diagrams that illustrate n-type and p-type gated resonant interband tunneling devices (GRITD) in accordance with some embodiments of the inventive concept.

FIGS. 4A and 4B are cross-sectional diagrams that illustrate n-type and p-type gated RITD (GRITD) devices according to some embodiments of the inventive concept. As shown in FIG. 4A, an n-type GRITD device comprises a metal gate CMOS transistor architecture in which the channel material is doped with NMOS dopants, but not at a degenerate level. Source and Drain regions, however, are degeneratively doped with NMOS dopants at dopant concentrations at least about $10^{19}$ cm$^{-3}$. The metal gate comprises a PMOS work function of at least about 5.1 eV. The work function of a metal is the energy required to remove an electron at the Fermi level to a vacuum outside the metal. The substrate/channel material 40 may comprise, but is not limited to, one or more of Si, Ge, InGaAs, C, MoS$_2$, Sn, and the like. The gate metal 45 may comprise, but is not limited to, one or more of Ti, TiN, TAlC, TaN, Al, W, and WN. The CMOS transistor architecture may be planar, nanowire, finfet, nanosheet, or other suitable configuration. The degenerate n-type doping of the source/drain regions combined with the p-type doping of the gate results in a surface energy band profile as shown in FIG. 4A, where the energy bands overlap at the channel junctions. As a result, the n-type GRITD device may exhibit an I-V (drain-source current vs. gate voltage) curve similar to that shown in FIG. 3 for varying levels of voltage applied between the drain and source terminals (Vds). FIG. 4B illustrates a p-type GRITD device that is complementary to the n-type GRITD shown in FIG. 4A. The p-type GRITD device comprises a metal gate CMOS transistor architecture in which the channel material is doped with PMOS dopants, but not at a degenerate level. Source and Drain regions, however, are degeneratively doped with PMOS dopants at dopant concentrations at least about $10^{19}$ cm$^{-3}$. The metal gate comprises an NMOS work function of not greater than about 4.2 eV. The substrate/channel material 42 may comprise, but is not limited to, one or more of Si, Ge, InGaAs, C, MoS$_2$, Sn, and the like. The gate metal 47 may comprise, but is not limited to, one or more of Ti, TiN, TAlC, TaN, Al, W, and WN. The CMOS transistor architecture may be planar, nanowire, finfet, nanosheet, or other suitable configuration. The degenerate p-type doping of the source/drain regions combined with the n-type doping of the gate results in a surface energy band profile as shown in FIG. 4B, where the energy bands overlap at the channel junctions. As a result, the p-type GRITD device may exhibit an I-V (drain-source current vs. gate voltage) curve similar to that shown in FIG. 3 for varying levels of voltage applied to the drain and source terminals (Vds), but is complementary to that of the n-type GRITD device.

Figure 5:
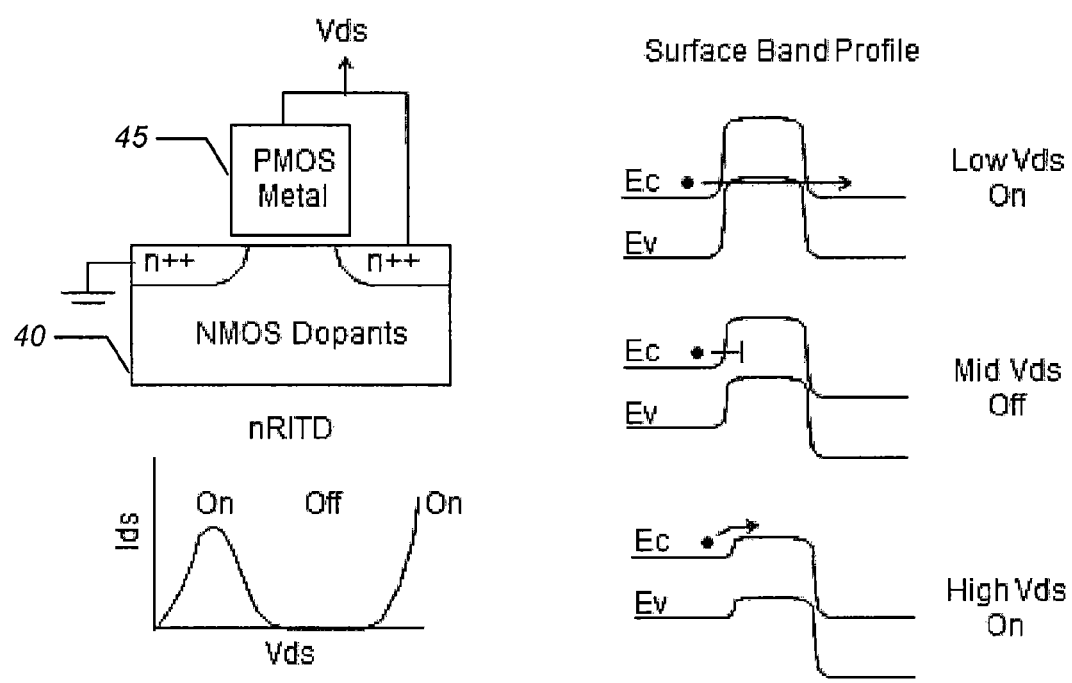
FIG. 5 is a cross-sectional diagram of an n-type GRITD device of FIG. 4A configured as a two-terminal RITD device in accordance with some embodiments of the inventive concept.

FIG. 5 is a cross-sectional diagram of the n-type GRITD device of FIG. 4A configured as a two-terminal non-gated RITD according to some embodiments of the inventive concept. As shown in the surface band profile diagrams of FIG. 5 and the Ids-Vds curve for the two-terminal RITD, when a small voltage is applied between the drain and source terminals, the drain-source current (Ids) increases due to the tunneling effect described above. This is illustrated as the low Vds "On" portion of the Ids-Vds curve. With increasing voltage, the energy bands cease to overlap resulting in a negative differential resistance portion of the Ids-Vds curve until there is very little tunneling or diffusion current. This corresponds to a mid range Vds value shown in the surface band profiles and the "Off" portion of the Ids-Vds curve. As the voltage Vds continues to increase, the Ids current increases due to diffusion current as represented by the "On" portion of the Ids-Vds curve and the high Vds surface band profile. Although FIG. 5 illustrates an n-type two-terminal RITD device based on the n-type GRITD device of FIG. 4A, it will be understood that a p-type two- terminal RITD device based on the p-type GRITD device of FIG. 4B can be formed in like fashion with similar operating principles according to various embodiments of the inventive concept.

In accordance with various embodiments of the inventive concept, the channels of the GRITD devices of FIGS. 4A and 4B (and corresponding two-terminal RITD configurations) may be doped at non-degenerate levels with p-type dopants and n-type dopants, respectively. This may allow the work function of the PMOS metal to be reduced or the NMOS metal to be increased, respectively. As a result, the peak-valley ratio for a device can be engineered through electrostatic screening via the gate in conjunction with non-degenerate doping of the channel. The peak current is based on tunnel barriers between the source/drain and the channel The primary device attributes that determine this are the gate work function and gate to source overlap. The valley current is based on source injection over a generally large barrier and diode leakage to the bulk substrate, both of which are generally independent of the gate work function and gate to source overlap. The ability to increase the peak-to-valley ratio may improve the stability of a bistable latch. Moreover, by using electrostatic screening via the gate germinal as opposed to degenerate doping the channel the device can operate at voltage levels more common in CMOS integrated circuit designs. A heavily doped degenerate channel may require large gate voltages to generate the electric fields large enough to deplete the channel to exhibit a full NDR I-V curve.

Figure 6:
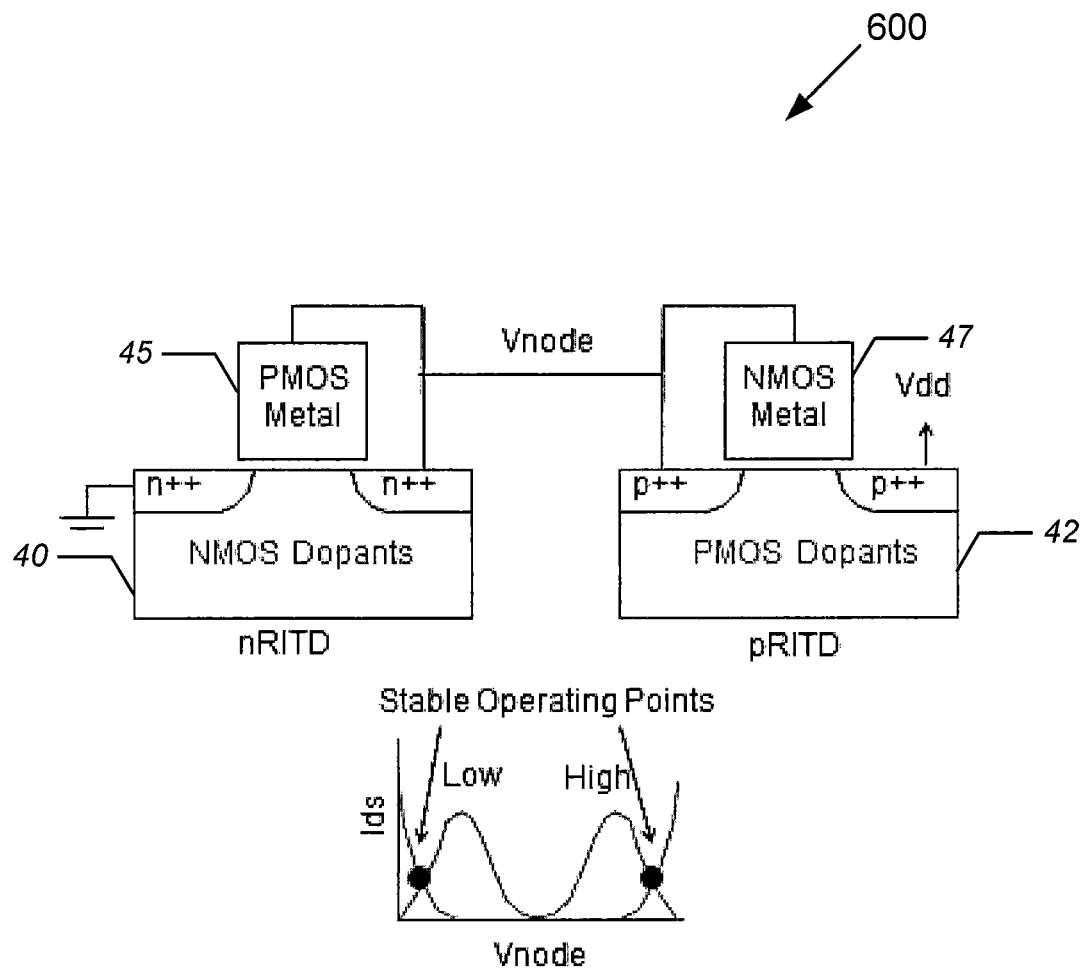
FIG. 6 is a cross-sectional diagram of a bistable latch in accordance with some embodiments of the inventive concept.

FIG. 6 is a cross-sectional diagram of a bistable latch 600 formed by connecting complementary conductivity type two-terminal RITD devices in series between a power supply voltage Vdd and a reference voltage, such as common or ground according to some embodiments of the inventive concept. A storage node Vnode may be formed where the gates of the n-type RITD device and the p-type RITD device connect. As shown in the Ids-Vnode curve for the bitable latch 600, two stable operating points can be obtained where the I-V curves of the individual RITD devices intersect. The two stable operating points may represent logic 0 and 1 states for one data bit and may exist at voltage levels close to ground and Vdd. The current level Ids at the stable operating points may be close to a transistor leakage current level.

Figure 7A:
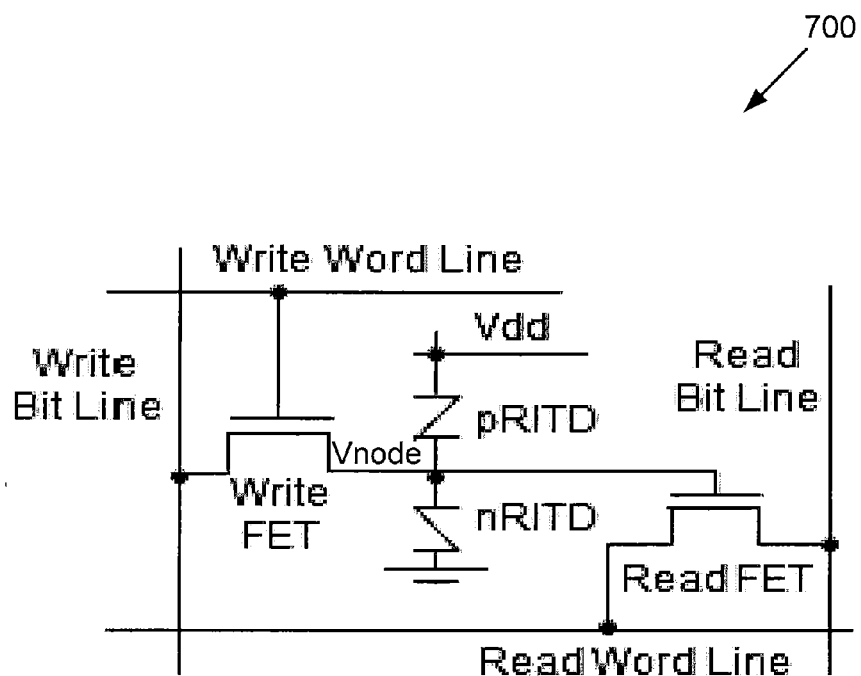
FIG. 7A is a circuit diagram of a SRAM memory cell in accordance with some embodiments of the inventive concept.
Figure 7B:
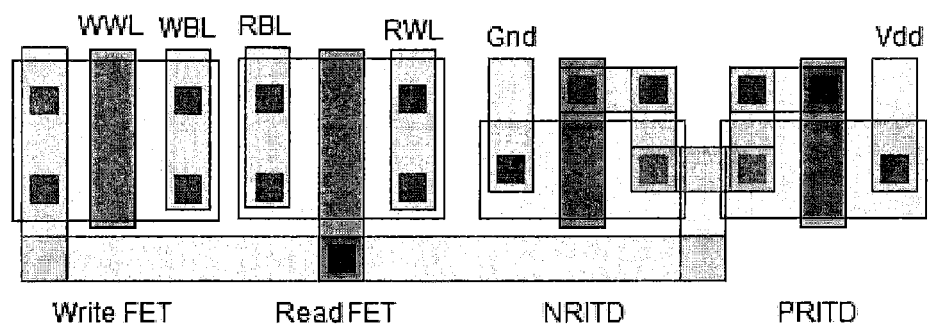
FIG. 7B is a layout diagram of the SRAM memory cell of FIG. 7A in accordance with some embodiments of the inventive concept.

FIG. 7A is a circuit diagram of a SRAM memory cell according to some embodiments of the inventive concept. FIG. 7B is a layout diagram of the SRAM memory cell of FIG. 7A according to some embodiments of the inventive concept. As shown in FIG. 7A, the SRAM memory cell 700 comprises a p-type RITD device and an n-type RITD device as described above with respect to FIGS. 4A, 4B, 5, and 6 connected in a totem pole configuration between Vdd, e.g., a power supply voltage, and a reference voltage, such as ground. As shown in FIGS. 7A and 7B, an NMOS write FET has a source terminal connected to a write bit line, a gate terminal connected to a write word line, and a drain terminal connected to a common drain node, which is the memory cell storage node Vnode. An NMOS read FET has a source terminal connected to a read bit line, a gate terminal connected to the common drain node Vnode, and a drain terminal connected to a read word line. In operation, when driving the write word line to a logic one level while holding the read word line and read bit lines at a logic zero level, a logic one or zero can be applied to the write bit line to store the data value at the storage node Vnode. When driving the read word line to a logic one level while maintaining the write word line and the write bit line at a logic zero level, the value of the data stored at the storage node Vnode can be read through the read bit line. As can be seen from FIGS. 7A and 7B, an SRAM memory cell can be implemented using four transistors rather than the six transistors used in conventional SRAM memory cells thereby reducing the amount of real estate consumed in an integrated circuit.

Figure 8A:
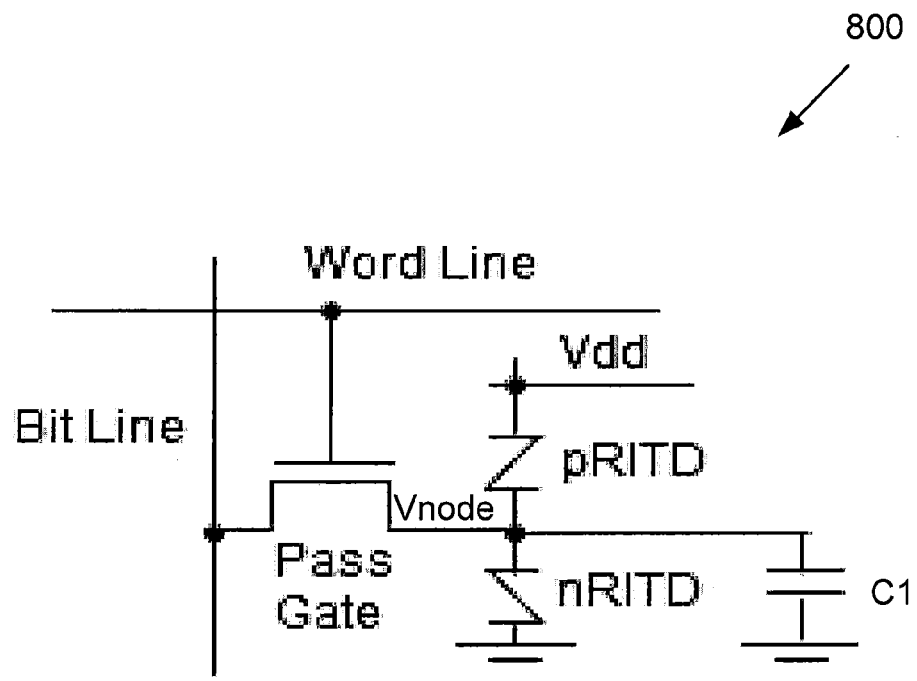
FIG. 8A is a circuit diagram of a SRAM memory cell in accordance with further embodiments of the inventive concept.
Figure 8B:
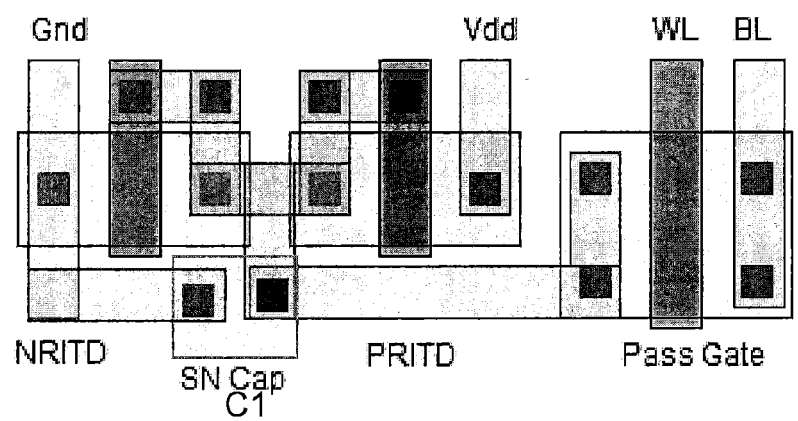
FIG. 8B is a layout diagram of the SRAM memory cell of FIG. 8A in accordance with some embodiments of the inventive concept.

FIG. 8A is a circuit diagram of a SRAM memory cell according to some embodiments of the inventive concept. FIG. 813 is a layout diagram of the SRAM memory cell of FIG. 8A according to some embodiments of the inventive concept. As shown in FIG. 8A, the SRAM memory cell 800 is configured the same as the SRAM memory cell 700 of FIG. 7A, but with the NMOS read FET being replaced by a capacitor C1 to function as a storage node between the node Vnode and ground. By eliminating the read FET, the layout real-estate required to implement the circuit is reduced relative to the embodiment of FIG. 7A as shown in the comparison between FIGS. 8B and 7B. In this embodiment, the write word and bit lines also function as read word and bit lines and one NMOS pass gate FET is used for both read and write operations. The read operation is passive and, therefore, may be slower than in the embodiment of FIG. 7A. The SRAM memory cell of FIG. 8A may behave as a DRAM cell without the need for refresh.

Figure 9:
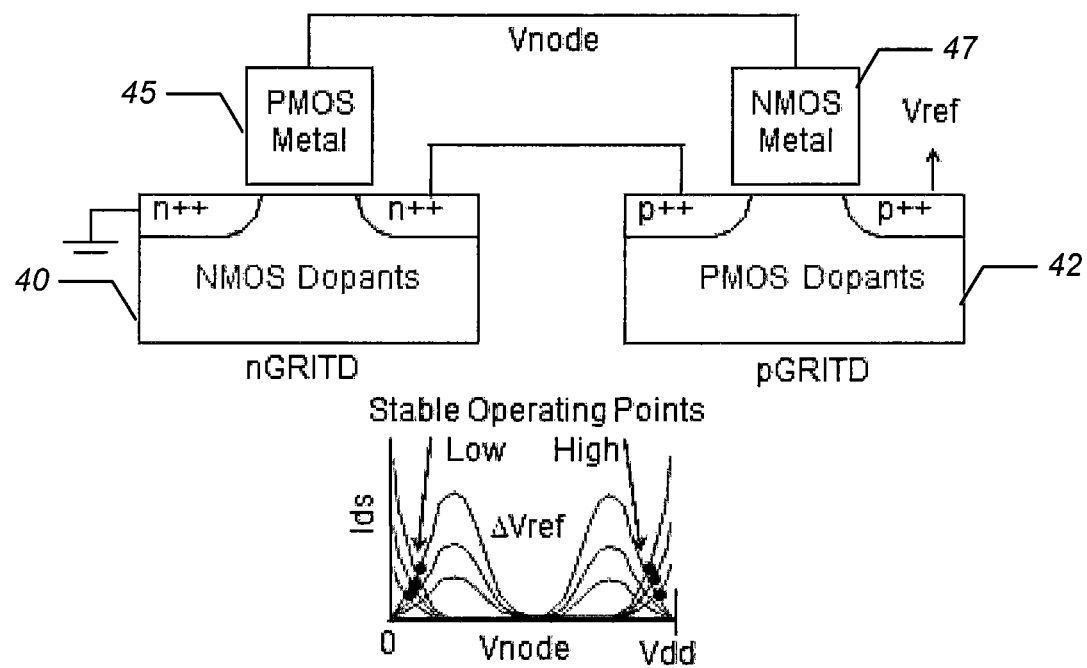
FIG. 9 is a cross-sectional diagram of a bistable latch using GRITD devices in accordance with some embodiments of the inventive concept.

FIG. 9 is a cross-sectional diagram of a bistable latch 900 formed by connecting complementary conductivity type GRITD devices in series between a first reference voltage Vref, which is less than a power supply voltage Vdd and a second reference voltage, such as common or ground according to some embodiments of the inventive concept. A storage node Vnode may be formed where the gates of the n-type GRITD device and the p-type GRITD device connect. The drain terminals of the n-type GRITD device and the p-type GRITD device are also connected separately. As shown in the Ids-Vnode curve for the bitable latch 900, two stable operating points can be obtained where the I-V curves of the individual GRITD devices intersect. The two stable operating points may represent logic 0 and 1 states for one data bit and may exist at voltage levels close to ground and Vdd. The voltage level Vref may be much less than Vdd, such as, for example, approximately 50 mV-200 mV and can be adjusted to set the stable operating point levels as shown in the Ids-Vnode curves. Because the voltage level Vref is lower than the power supply level Vdd, power consumption can be reduced. In some embodiments, the voltage level Vref may be set via programming during a device test for enhanced yield. The current level Ids at the stable operating points may be close to a transistor leakage current level.

Figure 10A:
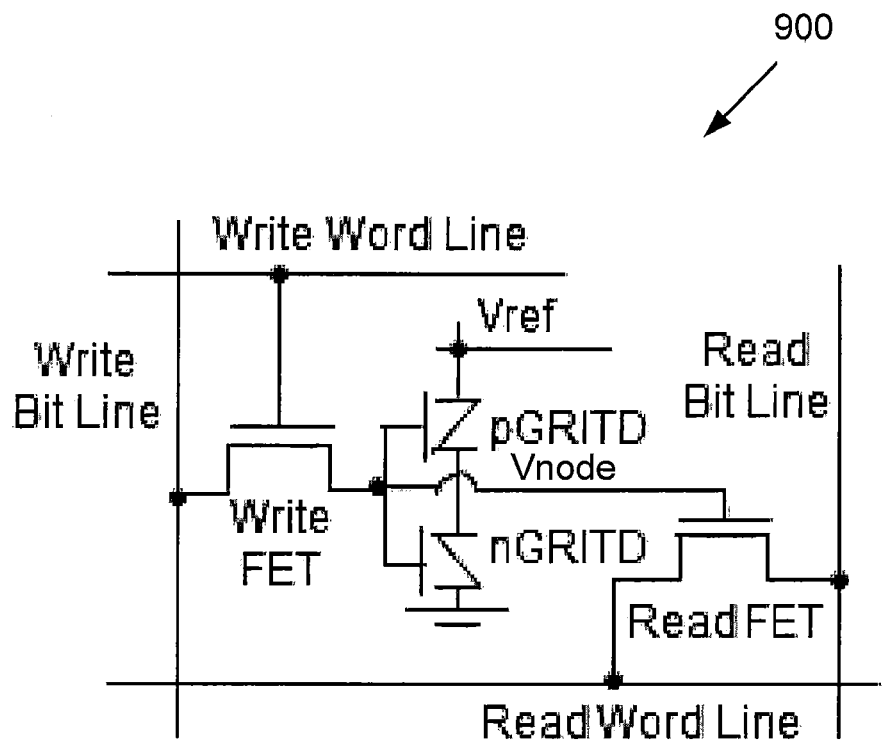
FIG. 10A is a circuit diagram of a SRAM memory cell in accordance with further embodiments of the inventive concept.
Figure 10B:
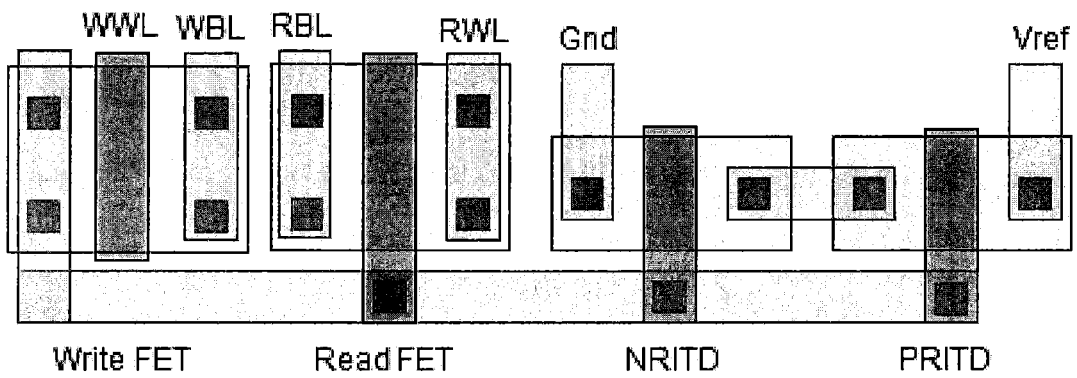
FIG. 10B is a layout diagram of the SRAM memory cell of FIG. 10A in accordance with some embodiments of the inventive concept.

FIG. 10A is a circuit diagram of a SRAM memory cell according to some embodiments of the inventive concept. FIG. 10B is a layout diagram of the SRAM memory cell of FIG. 10A according to some embodiments of the inventive concept. As shown in FIG. 10A, the SRAM memory cell 900 comprises a p-type GRITD device and an n-type GRITD device as described above with respect to FIGS. 4A, 4B, and 9 connected in series between Vref, e.g., a reference voltage less than a power supply voltage Vdd, and a reference voltage, such as ground. The gate terminals of the p-type and n-type GRITD devices are connected to each other and the drain terminals of the p-type and n-type GRITD devices are connected to each other. As shown in FIGS. 10A and 10B, an NMOS write FET has a source terminal connected to a write bit line, a gate terminal connected to a write word line, and a drain terminal connected to the common gate node, which is the memory cell storage node Vnode. An NMOS read FET has a source terminal connected to a read bit line, a gate terminal connected to the common gate node Vnode, and a drain terminal connected to a read word line. In operation, when driving the write word line to a logic one level while holding the read word line and read bit lines at a logic zero level, a logic one or zero can be applied to the write bit line to store the data value at the storage node Vnode. When driving the read word line to a logic one level while maintaining the write word line and the write bit line at a logic zero level, the value of the data stored at the storage node Vnode can be read through the read bit line. Similar to the embodiments of FIGS. 7A and 7B, an SRAM memory cell can be implemented using four transistors rather than the six transistors used in conventional SRAM memory cells thereby reducing the amount of real estate consumed in an integrated circuit.

An SRAM memory cell formed using the bistable latch 900 of FIG. 10A can be configured similar to that of FIG. 8A in which the NMOS read FET of FIG. 10A is removed and replaced by a capacitor in accordance with various embodiments of the inventive concept.

Figure 11:
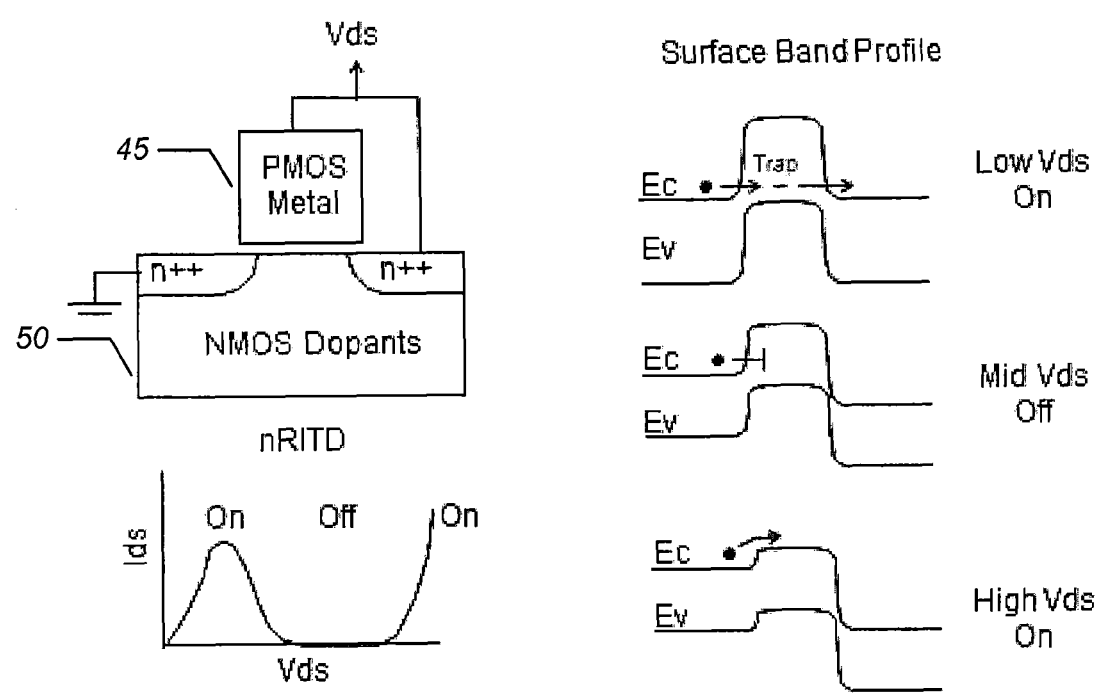
FIG. 11 is a cross-sectional diagram of an n-type RITD device having deep level traps formed therein in accordance with some embodiments of the inventive concept.

FIG. 11 is a cross-sectional diagram of the n-type RITD device of FIG. 5 according to some embodiments of the inventive concept in which the channel and substrate material 50 have deep level traps or deep level defects formed therein. Deep-level traps or deep level defects are considered "deep" in the sense that the energy required to remove an electron or hole from the trap to the valence or conduction band is much larger than the characteristic thermal energy. The deep traps provide states in the bandgap that electrons or holes can tunnel through. For n-type RITD or GRITD devices, the deep level traps or defects may be formed more proximal to the valence band edge. Conversely, for p-type RITD or GRITD devices, the deep level traps or defects may be formed more proximal to the conduction band edge. Thus, as shown in the surface band profile diagrams of FIG. 11 and the Ids-Vds curve for the two-terminal RITD, when a small voltage is applied between the drain and source terminals, the drain-source current (Ids) increases due to the tunneling effect described above. Moreover, this current level can be increased so as to drive the peak current Ids during the period that Ids is dominated by tunneling current due to the presence of the deep level traps or defects. This is illustrated as the low Vds "On" portion of the Ids-Vds curve. As described above with respect to FIG. 5, with increasing voltage, the energy bands cease to overlap resulting in an a negative differential resistance portion of the Ids-Vds curve until there is very little tunneling or diffusion current. This corresponds to a mid range Vds value shown in the surface band profiles and the "Off" portion of the Ids-Vds curve. As the voltage Vds continues to increase, the Ids current increases due to diffusion current as represented by the "On" portion of the Ids-Vds curve and the high Vds surface band profile. By increasing the Ids peak current a more stable latch can be achieved as the intersection points between the I-V curves of complementary RITD or GRITD devices connected in series can be placed farther apart with respect to Vds. Although FIG. 11 illustrates an n-type two-terminal RITD device with deep level traps or defects based on the n-type GRITD device of FIG. 4A, it will be understood that a p-type two-terminal RITD device with deep level traps or defects based on the p-type GRITD device of FIG. 4B can be formed in like fashion with similar operating principles according to various embodiments of the inventive concept.

Figure 12:
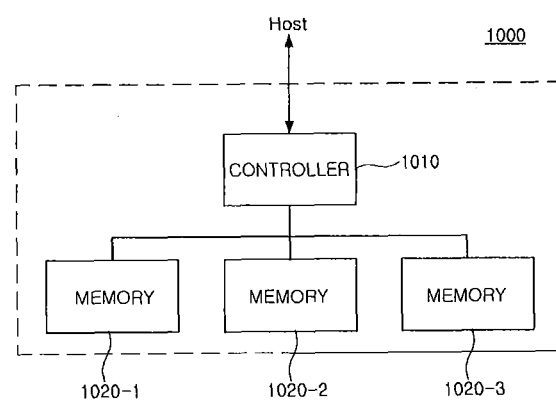
FIG. 12 is a block diagram of a storage apparatus including a semiconductor device in accordance with some embodiments of the inventive concept.

FIG. 12 is a block diagram of a storage apparatus including a semiconductor device according to an example embodiment of the inventive concept.

Referring to FIG. 12, a storage apparatus 1000, in accordance with some embodiments of the inventive concept, may comprise a controller 1010 configured to communicate with a host, and memories 1020-1, 1020-2, and 1020-3 configured to store data. The respective memories 1020-1, 1020-2, and 1020-3 may include one or more semiconductor devices according to various example embodiments of the inventive concept described with reference to FIGS. 2-11.

Examples of the host, which communicates with the controller 1010, may include various electronic devices on which the storage apparatus 1000 is mounted. For example, the host may be a smartphone, a digital camera, a desktop computer, a laptop computer, a portable media player, or the like. The controller 1010 may receive a data writing or reading request transferred from the host to store data in the memories 1020-1, 1020-2, and 1020-3 or generate a command (CMD) for retrieving data from the memories 1020-1, 1020-2, and 1020-3.

As illustrated in FIG. 12, at least one or more memories 1020-1, 1020-2, and 1020-3 may be connected to the controller 1010 in parallel in the storage apparatus 1000. The plurality of memories 1020-1, 1020-2, and 1020-3 may be connected to the controller 1010 in parallel to increase the capacity of the storage apparatus 1000.

Figure 13:
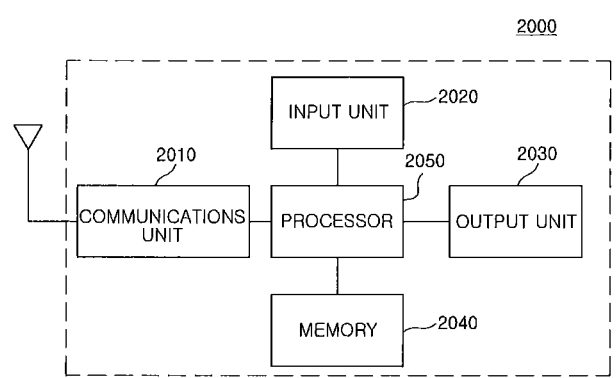
FIG. 13 is a block diagram of an electronic apparatus including a semiconductor device in accordance with some embodiments of the inventive concept.

FIG. 13 is a block diagram of an electronic apparatus including a semiconductor device according to an example embodiment of the inventive concept.

Referring to FIG. 13, an electronic apparatus 2000 according to the example embodiment may comprise a communications unit 2010, an input unit 2020, an output unit 2030, a memory 2040, and a processor 2050.

The communications unit 2010 may include a wired or wireless communications module, a wireless Internet module, a local area communications module, a global positioning system (GPS) module, a mobile communications module, and the like. The wired or wireless communications module included in the communications unit 2010 may be connected to external communications networks according to various communications standard specifications to transmit and receive data.

The input unit 2020 may be a module provided to control operation of the electronic apparatus 2000 by a user, and may include a mechanical switch, a touchscreen, a voice recognition module, and the like. In addition, the input unit 2020 may include a mouse operating in a track ball or a laser pointer configuration or a finger mouse device. In addition to these examples, the input unit 2020 may further include various sensor modules allowing user to input data thereby.

The output unit 2030 may output information processed in the electronic apparatus 2000 in a sound or image form, and the memory 2040 may store programs for the processing and the control of the processor 2050. The processor 2050 may transfer a command to the memory 2040 according to a requested operation to thereby store or retrieve data.

The memory 2040 may be embedded in the electronic apparatus 2000 to communicate with the processor 2050 or communicate with the processor 2050 directly or through a separate interface. In a case in which the memory 2040 communicates with the processor 2050 through a separate interface, the processor 2050 may store or retrieve data through various interface standards such as SD, SDHC, SDXC, MICRO SD, USB, and the like.

The processor 2050 may control operations of respective components included in the electronic apparatus 2000. The processor 2050 may perform control and processing in association with voice communications, video telephony, data communications, and the like, and/or may perform control and processing for multimedia reproduction and management. In addition, the processor 2050 may process an input transferred from a user through the input unit 2020, and may output results thereof through the output unit 2030. In addition, the processor 2050 may store data used in controlling the operation of the electronic apparatus 2000 as described above in the memory 2040, or fetch data from the memory 2040. At least one of the processor 2050 and the memory 2040 may include one or more of the semiconductor devices according to various example embodiments of the inventive concept described with reference to FIGS. 2-11.

Figure 14:
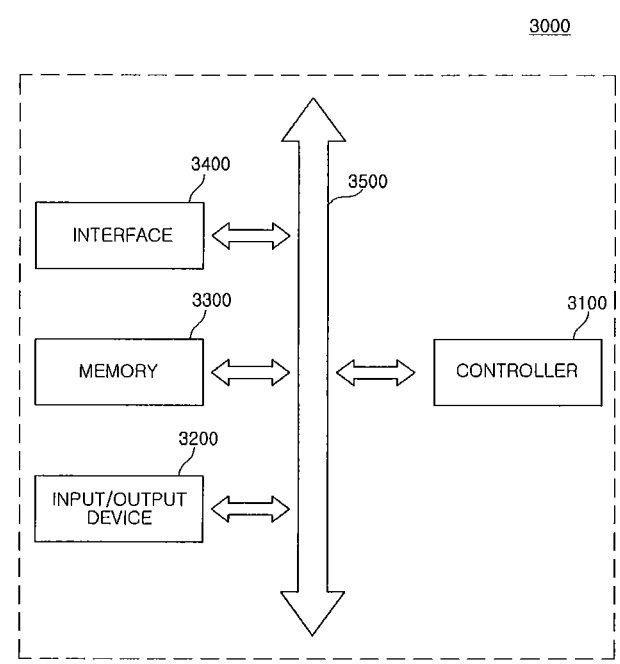
FIG. 14 is a schematic of a system including a semiconductor device in accordance with some embodiments of the inventive concept.

FIG. 14 is a schematic view of a system including a semiconductor device according to an example embodiment of the inventive concept.

Referring to FIG. 14, a system 3000 may include a controller 3100, an input/output device 3200, a memory 3300, and an interface 3400. The system 3000 may transmit or receive mobile system information. Examples of the mobile system may include, but are not limited to, PDAs, portable computers, web tablets, wireless phones, mobile phones, digital music players, and memory cards.

The controller 3100 may be configured to execute a program and control the system 3000. The controller 3100 may be a microprocessor, a digital signal processor, a microcontroller, or a device similar thereto.

The input/output device 3200 may be used to input or output data to or from the system 3000. The system 3000 may be connected to an external device, such as a personal computer or networks, and may exchange data with the external device. The input/output device 3200 may be a keypad, a keyboard, or a display device.

The memory 3300 may store a code and/or data for operating the controller 3100 and/or store data having been processed by the controller 3100. The memory 3300 may include one or more semiconductor devices according to example embodiments of the inventive concept described with respect to FIGS. 2-11.

The interface 3400 may be a data transmission path between the system 3000 and an external device. The controller 3100, the input/output device 3200, the memory 3300, and the interface 3400 may be in communication with one another via a bus 3500.

At least one of the controller 3100 or the memory 3300 may include one or more of the semiconductor devices according to various example embodiments of the inventive concept described with reference to FIGS. 2-11.

Further Definitions and Embodiments:

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout the description. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. As used herein, the term "and/or" includes any and all combinations of one or more of the associated listed items. Like reference numbers signify like elements throughout the description of the figures.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

The corresponding structures, materials, acts, and equivalents of any means or step plus function elements in the claims below are intended to include any disclosed structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

What is claimed is:

1. A semiconductor device comprising:
a first diode connected transistor of a first conductivity type and a second diode connected transistor of a second conductivity type connected in series, each of the first and second diode connected transistors being configured to exhibit negative differential resistance in response to an applied voltage;
wherein first drain and first source regions of the first diode connected transistor comprise dopants of the first conductivity type at degenerate dopant concentration levels and a gate of the first diode connected transistor comprises dopants of the second conductivity type; and
wherein second drain and second source regions of the second diode connected transistor comprise dopants of the second conductivity type at degenerate dopant concentration levels and a gate of the second diode connected transistor comprises dopants of the first conductivity type.

2. The semiconductor device of claim 1, wherein a channel region of the first diode connected transistor comprises dopants of the second conductivity type at a non-degenerate dopant concentration level; and
wherein a channel region of the second diode connected transistor comprises dopants of the first conductivity type at a non-degenerate dopant concentration level.

3. The semiconductor device of claim 2, wherein the dopant concentration levels of the first drain and the first source regions and the dopant concentration levels of the second drain and the second source regions are each at least $10^{19}$ cm$^{-3}$.

4. The semiconductor device of claim 2, wherein the first conductivity type is n-type and the second conductivity type is p-type; and
wherein the gate of the first diode connected transistor has a work function of at least about 5.1 eV and the gate of the second diode connected transistor has a work function not greater than about 4.2 eV.

5. The semiconductor device of claim 2, wherein the channel region of the first diode connected transistor has first deep level traps formed therein; and wherein the channel region of the second diode connected transistor has second deep level traps formed therein.

6. The semiconductor device of claim 5, wherein the first deep level traps are formed more proximal to the valence band edge than the conduction band edge; and
wherein the second deep level traps are formed more proximal to the conduction band edge than the valence band edge.

7. The semiconductor device of claim 2, wherein the channel region of the first diode connected transistor and the channel region of the second diode connected transistor each comprise at least one of Si, Ge, InGaAs, C, MoS$_2$, and Sn.

8. The semiconductor device of claim 1, wherein the first diode connected transistor and the second diode connected transistor are connected at a storage node, the device further comprising:
a write field effect transistor comprising a source terminal connected to a write bit line, a gate terminal connected to a write word line, and a drain terminal connected to the storage node; and
a read field effect transistor comprising a source terminal connected to a read bit line, a gate terminal connected to the storage node, and a drain terminal connected to a read word line.

9. The semiconductor device of claim 1, wherein the first diode connected transistor and the second diode connected transistor are connected at a storage node, the device further comprising:
a pass gate field effect transistor comprising a source terminal connected to a bit line, a gate terminal connected to a word line, and a drain terminal connected to the storage node; and
a capacitor connected to the storage node.

10. A semiconductor device comprising:
a first transistor of a first conductivity type and a second transistor of a second conductivity type connected in series, each of the first and second transistors being configured to exhibit negative differential resistance in response to an applied voltage;
wherein first drain and first source regions of the first transistor comprise dopants of the first conductivity type at degenerate dopant concentration levels and a gate of the first transistor comprises dopants of the second conductivity type; and
wherein second drain and second source regions of the second transistor comprise dopants of the second conductivity type at degenerate dopant concentration levels and a gate of the second transistor comprises dopants of the first conductivity type.

11. The semiconductor device of claim 10, wherein the first transistor and the second transistor are connected in series between a reference voltage and a common voltage; and
wherein the reference voltage is less than a power supply voltage.

12. The semiconductor device of claim 11, wherein the reference voltage is in a range of approximately 50 mV-200 mV.

13. The semiconductor device of claim 10, wherein a channel region of the first transistor comprises dopants of the second conductivity type at a non-degenerate dopant concentration level; and
wherein a channel region of the second transistor comprises dopants of the first conductivity type at a non-degenerate dopant concentration level.

14. The semiconductor device of claim 13, wherein the dopant concentration levels of the first drain and the first source regions and the dopant concentration levels of the second drain and second source regions are each at least $10^{19}$ cm$^{-3}$.

15. The semiconductor device of claim 13, wherein the first conductivity type is n-type and the second conductivity type is p-type; and
wherein the gate of the first transistor has a work function of at least about 5.1 eV and the gate of the second transistor has a work function not greater than about 4.2 eV.

16. The semiconductor device of claim 13, wherein the channel region of the first transistor has first deep level traps formed therein; and
wherein the channel region of the second transistor has second deep level traps formed therein.

17. The semiconductor device of claim 16, wherein the first deep level traps are formed more proximal to the valence band edge than the conduction band edge; and
wherein the second deep level traps are formed more proximal to the conduction band edge than the valence band edge.

18. The semiconductor device of claim 13, wherein the channel region of the first transistor and the channel region of the second transistor each comprise at least one of Si, Ge, InGaAs, C, MoS$_2$, and Sn.

19. The semiconductor device of claim 10, wherein a gate terminal of the first transistor and a gate terminal of the second transistor are connected at a storage node and the first drain region and the second drain region are connected separately from the storage node, the device further comprising:
a write field effect transistor comprising a source terminal connected to a write bit line, a gate terminal connected to a write word line, and a drain terminal connected to the storage node; and
a read field effect transistor comprising a source terminal connected to a read bit line, a gate terminal connected to the storage node, and a drain terminal connected to a read word line.

20. The semiconductor device of claim 10, wherein a gate terminal of the first transistor and a gate terminal of the second transistor are connected at a storage node and the first drain region and the second drain region are connected separately from the storage node, the device further comprising:
a pass gate field effect transistor comprising a source terminal connected to a bit line, a gate terminal connected to a word line, and a drain terminal connected to the storage node; and
a capacitor connected to the storage node.

* * * * *